(12) United States Patent
Tamura et al.

(10) Patent No.: US 7,541,211 B2
(45) Date of Patent: Jun. 2, 2009

(54) PHOTOELECTRIC CONVERSION DEVICE, ITS MANUFACTURING METHOD, AND IMAGE PICKUP DEVICE

(75) Inventors: Seiichi Tamura, Yokohama (JP);
Hiroshi Yuzurihara, Atsugi (JP);
Shigeru Nishimura, Ebina (JP);
Ryuichi Mishima, Machida (JP);
Yasushi Nakata, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 118 days.

(21) Appl. No.: 11/318,930

(22) Filed: Dec. 28, 2005

(65) Prior Publication Data

US 2006/0141655 A1 Jun. 29, 2006

(30) Foreign Application Priority Data

Dec. 28, 2004 (JP) ............................. 2004-379954

(51) Int. Cl.
*H01L 21/00* (2006.01)
(52) U.S. Cl. ....................................................... 438/48
(58) Field of Classification Search .................... 438/48
See application file for complete search history.

(56) References Cited

U.S. PATENT DOCUMENTS 5,838,058 A 11/1998 Kitajima et al. ............. 257/628

2005/0006676 A1* 1/2005 Watanabe .................... 257/290
2005/0088556 A1* 4/2005 Han ............................. 348/308

FOREIGN PATENT DOCUMENTS

| JP | 64-033924 A1 | 2/1989 |
| JP | 02-177426 A1 | 7/1990 |
| JP | 03-248422 A2 | 11/1991 |
| JP | 4-343479 | 11/1992 |
| JP | 7-172990 | 7/1995 |

* cited by examiner

*Primary Examiner*—Brook Kebede
*Assistant Examiner*—Tony Tran
(74) *Attorney, Agent, or Firm*—Fitzpatrick, Cella, Harper & Scinto

(57) ABSTRACT

It is an object of the present invention to provide a manufacturing method of a photoelectric conversion device in which no plane channeling is produced even if ions are injected at a certain elevation angle into a semiconductor substrate surface made of silicon. A manufacturing method of a photoelectric conversion device including a silicon substrate and a photoelectric conversion element on one principal plane of the silicon substrate, wherein the principal plane has an off-angle forming each angle θ with at least two planes perpendicular to a reference (1 0 0) plane within a range of 3.5°≦θ≦4.5°, and an ion injecting direction for forming an semiconductor region constituting the photoelectric conversion element forms an angle φ to a direction perpendicular to the principal plane within a range of 0°<φ≦45°, and further a direction of a projection of the ion injecting direction to the principal plane forms each angle α with the two plane direction within a range of 0°<α<90°.

5 Claims, 7 Drawing Sheets

US 7,541,211 B2

PHOTOELECTRIC CONVERSION DEVICE, ITS MANUFACTURING METHOD, AND IMAGE PICKUP DEVICE

BACKGROUND OF THE INVENTION

1. Field of the Invention

The present invention relates to a photoelectric conversion device, and more specifically to a MOS type photoelectric conversion device and its manufacturing method.

2. Related Background Art

A demand of a photoelectric conversion device has been rapidly rising in recent years by being used as a photoelectric conversion device of a two-dimensional image input apparatus laying stress on a digital still camera and a video camcorder, or a one-dimensional image reading apparatus laying stress on a facsimile and a scanner.

As the photoelectric conversion device, a CCD and a MOS type photoelectric conversion device are used. As a representative of the MOS type photoelectric conversion device, a CMOS photoelectric conversion device (hereinafter referred to as a "CMOS sensor") formed by the CMOS process including peripheral circuits has been put to practical use.

FIG. 8 is a circuit composition figure of a pixel of a conventional CMOS sensor. A reference numeral 1 denotes a photodiode (hereinafter referred to as a "PD") as a photoelectric conversion element converting light into signal charges. A reference numeral 2 denotes a transfer MOS transistor transferring the signal charges generated by the PD 1. A reference numeral 3 denotes a floating diffusion region (hereinafter referred to as an "FD") for converting the signal charges into a voltage. A reference numeral 4 denotes a reset MOS transistor for resetting the FD 3 and the PD 1. A reference numeral 5 denotes a selector MOS transistor for selecting an arbitrary row in an array. A reference numeral 6 denotes a source follower MOS transistor line of an array and 6 are the source follower MOS transistor for amplifying a signal charge. These components constitute a pixel. A reference numeral 7 denotes a sense line, which is commonly owned by column for reading a pixel signal. A reference numeral 8 denotes a constant current source. One or both of a circuit for processing a signal from the pixel and a drive circuit (shift register) for driving the transistors in the pixel circuit are formed on the same substrate as peripheral circuits, though they are not shown. Each pixel (except for the constant current source 8) is arranged in an array, and constitutes a photoelectric conversion device.

FIG. 9 is a schematic sectional view of a pixel of a photoelectric conversion device mounting the conventional CMOS sensor thereon. In particular, FIG. 9 shows a part of the PD 1 and the transfer MOS transistor 2 in FIG. 8. A reference numeral 11 denotes an N-type silicon substrate. A reference numeral 12 denotes a P-type well. A reference numeral 13a denotes a gate insulation film of a MOS transistor, which is made of a silicon oxide film. A reference numeral 13b denotes a silicon oxide film on a light receiving portion. A reference numeral 14 denotes a gate electrode of the transfer MOS transistor 2. A reference numeral 15 denotes an N-type charge storage region for forming the PD 1. A reference numeral 16 denotes a surface P-type region for making the PD 1 to have an embedded structure. A reference numeral 17 denotes a selection oxide film for element isolation. A reference numeral 18 denotes an N-type impurity region which forms the FD 3 and is also a drain region of the transfer MOS transistor 2. A reference numeral 19 denotes a silicon oxide film insulating the gate electrode 14 and a first wiring layer 21. A reference numeral 20 denotes a contact plug. A reference numeral 22 denotes an interlayer insulation film insulating the first wiring layer 21 and a second wiring layer 23. A reference numeral 24 denotes an interlayer insulation film insulating the second wiring layer 23 and a third wiring layer 25. A reference numeral 26 denotes a passivation film. In a photoelectric conversion device for color use, a not shown color filter layer and further a not shown microlens for improving sensitivity are formed on the upper layer of the passivation film 26. The p-type impurity region 12 and the N-type impurity region 15 constitute a PD 3.

The light having entered the surface enters the PD through an opening portion regulated by the third wiring layer 25. The light is absorbed in the N-type charge storage region 15 or the P-type well 12 of the PD to generate pairs of electrons and holes. The electrons of the pairs are stored in the N-type charge storage region 15. After the storage, by turning on the transfer gate 14, the reading of the electrons into the FD 3, where potential is lower, is performed. After the reading operation, by performing the resetting operation of the N-type charge storage region 15 through the transfer MOS, the N-type charge storage region 15 is completely depleted to a certain voltage. Then, the FD 3 is held at a certain voltage by a similar resetting operation after the turning off of the transfer gate 14.

In the CMOS sensor, in order to efficiently transfer the carriers generated in the PD to the FD 3 through the transfer gate 14 at the time of a reading operation, it is very important to deplete the N-type charge storage region 15 by a desired voltage, especially preferably to completely deplete the N-type charge storage region 15. The depleting voltage is determined by the kind of the photoelectric conversion device, the purpose of use, and the like. Various depleting voltages are set according to the charge quantity which the PD can deal with, a noise characteristic, a drive voltage and the like. These depleting voltages are important parameters influential on the characters of the photoelectric conversion devices.

Simultaneously, the N-type charge storage region 15 is distributed in a form in which the N-type charge storage region 15 is inserted between the surface P-type region 16 and the P-type well 12 in the lower left end part of the transfer gate 14. The density profile of the region 15a is another important parameter influential on the transfer characteristic because the place is a passing road (transfer path 15a) of the charges from the depleted N-type charge storage region 15.

The semiconductor regions such as the surface P-type region and the N-type charge storage region 15, as shown above, receive the performance of patterning by photolithography in a desired region before the semiconductor regions are formed by an ion implantation technique. It is needless to say that the accuracy of energy and a dose quantity for obtaining a desired depleting voltage in good accuracy, as described above.

Moreover, it is necessary that the transfer path 15a mentioned above gets into the lower left end portion of the transfer gate 14 (to be arranged under at least a part of the gate electrode) and is formed in a desired density. Accordingly, the injection is performed to be inclined by a certain angle to the normal line of the mirror surface of a wafer. In this case, it is necessary that the injection is performed uniformly on the wafer surface not only the angle thereof but also the parallelism thereof and the like, and satisfying these necessities are important control techniques for minimizing the dispersion of the desired transfer characteristics.

Moreover, as another parameter for controlling the profile of the ion implantation, there is known a method of performing the ion implantation to a semiconductor substrate from an inclined direction not from the perpendicular direction to reduce the dispersion in the depth direction of the impurity profile caused by channeling.

For example, in the case of performing ion implantation using a semiconductor substrate having a crystal plane (1 0 0) as one principal plane, it is well known that the ion injecting direction may be inclined from the vertical direction by about 7°.

Then, in order to perform the ion implantation itself perpendicularly and to avoid the channeling mentioned above, there have been proposed a method of using a semiconductor substrate having the principal plane thereof inclined (off-angled) by an angle within a range of from 3° to 7° to the crystal plane (1 0 0) (Japanese Patent Application Laid-Open No. H04-343479), a method of using a semiconductor substrate having a plane on which the <1 0 0> axis perpendicular to the crystal plane (1 0 0) is inclined into the direction of (0 1 1) plane and (0 1 $\bar{1}$) plane by an angle within a range of from 3.5° to 10° as a principal plane (Japanese Patent Application Laid-Open No. H07-172990; U.S. Pat. No. 5,838,058 (corresponding application in US)), and the like.

Moreover, the channeling can be also suppressed by forming an amorphous film such as an oxide film on the surface of a substrate. In order to avoid contamination caused by a metal or the like, at the time of ion implantation, an oxide film having a thickness of about 10-30 nm is frequently formed on the surface of the substrate. In the conventional process in which ion implantation is performed by the comparatively low energy of about 10-200 keV in a state in which an oxidization film is formed on the surface of a substrate, it is expected that the conventional techniques disclose in the official publications mentioned above demonstrates validity.

Moreover, also in the case where a semiconductor substrate inclined into [0 1 1] direction by 4° is used and ion implantation is performed from the direction perpendicular to the semiconductor substrate, the ion implantation has the similar effects to those of the related art disclosed in the public publications mentioned above. In this case, because an amorphous layer such as a silicon oxide film is formed on the surface of a substrate at the time of ion implantation and thermal processing at a high temperature for a long period is performed after ion implantation, the formation of a comparatively uniform impurity introduction layer is made to be possible.

As described above, although the PD structure of a CMOS type photoelectric conversion device has an advantage of the capability of using the existing CMOS process, the PD structure has several problems for the improvement in an image pick-up performance.

A first problem is the necessity of performing ion implantation after determining an injecting angle so as to satisfy a desired transfer characteristic to a semiconductor substrate. When only caring about projection of photoresist and the like to making the injecting angle perpendicular and performing ion implantation, as shown in Japanese Patent Application Laid-Open Nos. H04-343479 and H07-172990, it is possible to suppress channeling to some extent by inclining the principal plane orientation of a semiconductor board. However, when positioning and density setting with the high accuracy of a semiconductor region which exists under a gate are required like in the case of forming the N-type charge storage region 15, even if the manufacturing methods like the ones disclosed in the Japanese Patent Application Laid-Open Nos. H04-343479 and H07-172990 are used, then highly accurate positioning and density setting become difficult under the influence of channeling. The reason is that, when ion implantation is performed from the direction perpendicular to the principal plane, an off-angle direction is determined not to cause channeling, and that a case where a process of performing ion implantation also from an inclined direction in order to form a semiconductor region in a part under the gate electrode of a transfer MOS transistor is included is not supposed. Because ion implantation is performed under the setting of an injecting angle of combinations in a wide range of from 0 to 45° at the time of forming the N-type charge storage region and the surface P type region of a PD, at some injecting angles channeling cannot be prevented even in a semiconductor substrate including the principal plane inclined in the direction of from the crystal principal plane (1 0 0) to a (0 1 1) plane or from the crystal principal plane (1 0 0) to a (0 1 $\bar{1}$) plane like the technique disclosed in Japanese Patent Application Laid-Open No. H07-172990.

A second problem is that the drive voltage of a CMOS sensor has become lower as the degrees of the fineness and the integration of the CMOS sensor has increased, and consequently that the mask oxide film at the time of ion implantation has become thinner and the activation of an impurity profile has become unable to exert the effect up to the degree of cancelling channeling owing to the lowering of the temperature of thermal treatment.

Such tendencies of increasing fineness of processes and the lowering of the temperature are process integration necessary for a future CMOS sensor, and the existing channeling preventing measures seriously hinders the increase of the degree of integration of solid state image pickup elements and the use of a large diameter substrate.

A third problem is that, although the pixel arrangement of an ordinary CMOS sensor is arranged so that pixel pitches may become equal and their directions are also arranged into the same directions, especially in a large-sized CMOS sensor, the layout of a product may become a rectangle owing to the restriction of the drawing area of exposure equipment. In such a case, the directions of PD's and transfer gates are frequently arranged in a layout of being in any one of the directions 90°, 180° and 270° to notches or orientation flats, and the case where the directions do not agree with the optimum solution of channeling is very frequently produced.

It is an object of the present invention to provide a photoelectric conversion device which can realize a PD structure contributing to the improvement of an image pickup performance by regulating the off-angle direction of the principal plane of a semiconductor substrate for forming a photoelectric conversion element, and the formation direction of a semiconductor region constituting the photoelectric conversion element, and its manufacturing method.

SUMMARY OF THE INVENTION

As the means to attain the object mentioned above, the present invention regulates the direction of an off-angle of one principal plane forming an element, and the formation direction of a semiconductor region constituting a photoelectric conversion element.

Other features and advantages of the present invention will be apparent from the following description taken in conjunction with the accompanying drawings, in which like reference characters designate the same or similar parts throughout the figures thereof.

The present invention is a manufacturing method of a photoelectric conversion device including a silicon substrate, a plurality of photoelectric conversion elements each including a charge storage region on one principal plane of the silicon substrate, and a plurality of transfer MOS transistors for transferring charge from the charge storage regions, wherein the principal plane has an off-angle orientation forming an angle θ with at least two planes arranged in opposition to each other and perpendicular to a reference (1 0 0) plane within a range of 3.5°≦θ≦4.5°, the at least two planes forming a two plane direction, and the same ion injecting direction is used for forming the charge storage regions of the plurality of photoelectric conversion elements, such that for each of the plurality of photoelectric conversion elements the ion injecting direction forms an angle φ to a direction perpendicular to the principal plane within a range of 0°<φ≦45°, and further a direction of a projection of the ion injecting direction to the principal plane forms an angle α with the above-mentioned two plane direction within a range of 0°<α<90°.

The accompanying drawings, which are incorporated in and constitute a part of the specification, illustrate embodiments of the invention and, together with the description, serve to explain the principles of the invention.

DESCRIPTION OF THE PREFERRED EMBODIMENTS

The embodiments of the present invention are described with reference to the drawings.

Embodiment 1

Figure 1A:
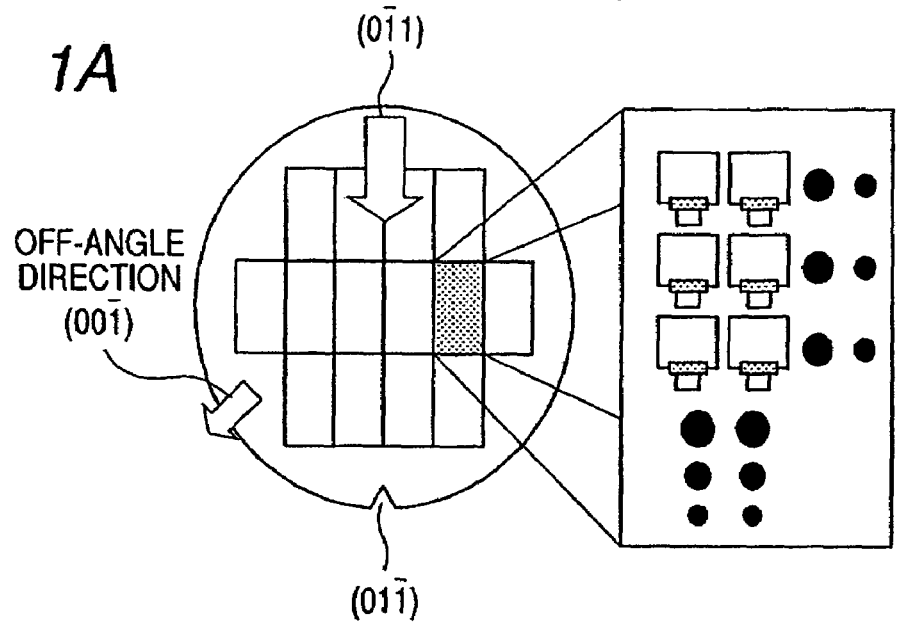
FIG. 1A is a figure showing a semiconductor substrate of a CMOS sensor and a PD forming method in Embodiment 1.
Figure 1B:
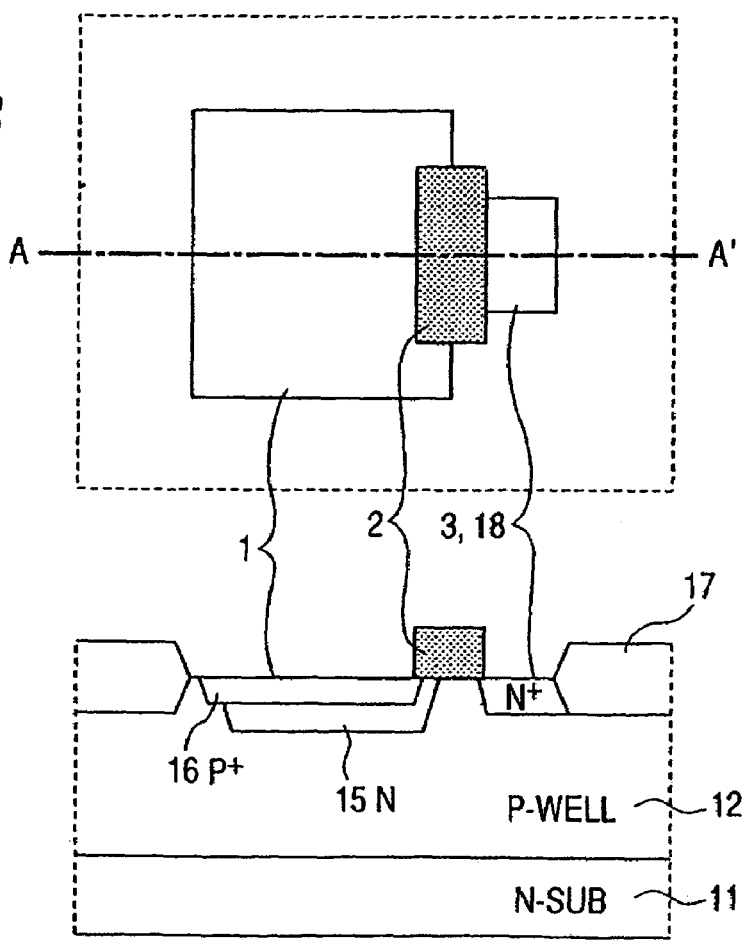
FIG. 1B is a plan view in the neighborhood of a PD of the CMOS sensor in Embodiment 1.

FIG. 1A is a figure for illustrating a PD region forming method of a CMOS sensor in the present embodiment, and a figure especially showing the arrangement relation between the off-angle direction of a principal plane for forming the elements of a semiconductor substrate, and PD's, transfer gates and floating diffusion regions (FD's). Moreover, FIG. 1B shows a plan view of a PD, a transfer gate and an FD, and a cross section taken along an A-A' line in the plan view. Here, each PD region is formed in a P-type well region formed in a desired impurity density profile in advance, and is electrically isolated by each element by an element isolation region 17 by LOCOS isolation or the like. A transfer gate 2 is formed in each PD region by performing the patterning of a polysilicon material or a silicide material.

In the present embodiment, a wafer notch position show (0 1 1̄) plane direction, and a semiconductor substrate is used in which a principle plane, on which elements are formed, is off-angled by 4° from a reference (1 0 0) plane into a direction of a (0 0 1̄) plane perpendicular to the (1 0 0) plane. Then, the arrangement direction of the FD to the reference PD is the (0 1 1̄) direction, in which the notch is formed. The N-type charge storage region 15 receives ions injected at a desired angle in a way of getting into under the transfer gate from (0 1̄ 1) plane direction. The desired angle is concretely an angle φ within a range of 0<φ≦45° to the direction of the off-angled principal plane. The present embodiment is configured such that a semiconductor region constituting a photoelectric conversion element is arranged under a part of the gate electrode of a transfer MOS transistor, and that the direction of the region arranged under the gate electrode against the reference of the photoelectric conversion element forms an angle α to the off-angle direction within a region of 0°<α<90°.

Figure 2:
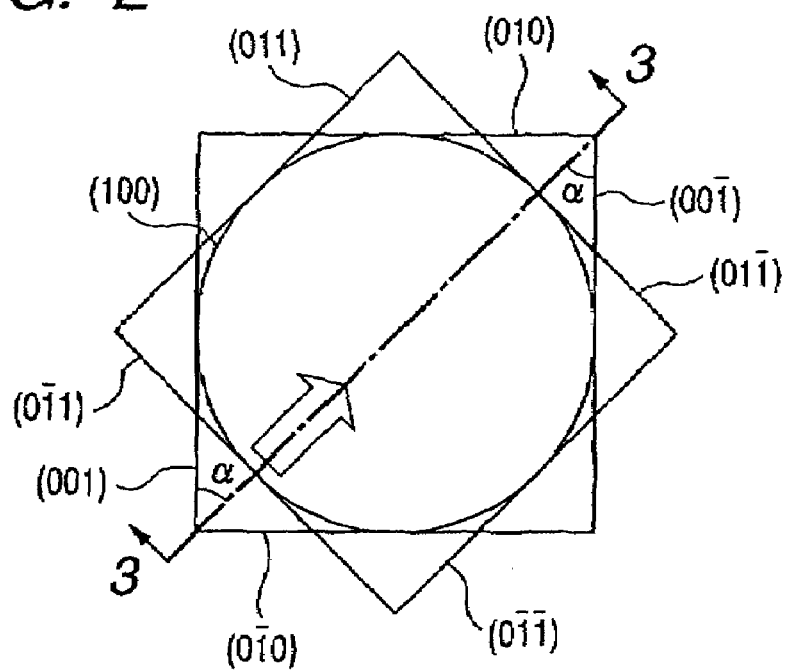
FIG. 2 is a diagram for illustrating angles formed between a reference plane and each crystal plane perpendicular to the reference plane, and angles formed between the reference plane and ion injecting directions.

In the present embodiment, because the angle between the direction in which the N-type charge. storage region 15 is injected, or correctly the direction in which the N-type charge storage region 15 is projected on the principal plane in the injection direction, and the direction of the off-angle is in the relation of 45°, the channeling characteristic is reduced independent of the injection angle. A schematic diagram for illustrating the angle formed between the off-angle direction and the projected direction of the ion injecting direction to the principal plane is shown in FIG. 2. Although the principal plane is a substrate having the off-angle against the reference of the (1 0 0) plane actually, the (1 0 0) plane is shown as the principal plane for purposes of illustration. An arrow direction indicates the direction in which the of an arrow shows the projected direction of the ion injecting direction onto the principal plane, and forms the angle α, which is 45°, with an (0 0 1̄) plane, which is the off-angle direction.

Figure 3:
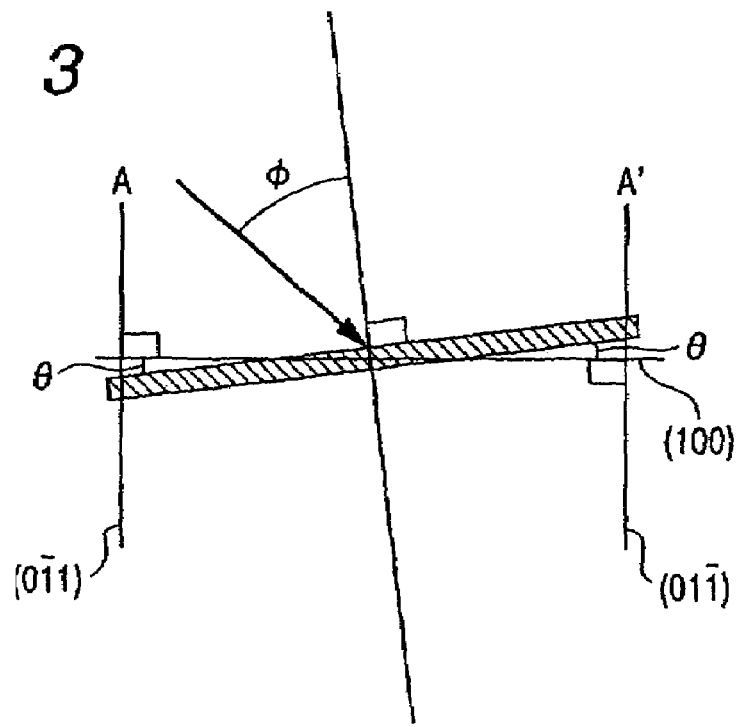
FIG. 3 is a schematic sectional view taken along a 3-3 line in FIG. 2.

FIG. 3 is a figure showing the cross section taken along the 3-3 line of FIG. 2. An angle formed between a direction perpendicular to the principal plane and the ion injecting direction is shown by a character φ, and the angle φ is set within a range of 0°φ≦45° according to the characteristic of an element. Moreover, a character θ denotes the angle of the off-angle. The off-angle θ is preferably 4°, but the off-angle θ may be set within a range of 3.5°≦θ≦4.5°.

Here, as for the angle a formed between the off-angle direction and the direction in which the ion injecting direction is projected onto the principal plane, when the angle α is, for example, 0° or 90°, there is a case where the off-angled principal plane and the ion injecting direction becomes parallel to each other. In the case where the principal plane and the ion injecting direction become parallel to each other, there are no silicon atoms, which prevent the channeling. Consequently, ions exist with the dispersion in the depth direction. Accordingly, the angle α is set within the range of 0°<α<90° excluding 0° and 90°. In this case, because the direction of 45° is the direction in which the silicon atoms exist most densely, the direction of 45° is preferable. But, the direction α may be within a range of 40°≦α≦50°.

Although the semiconductor substrate having the principal plane off-angled by 4° into the (0 0 1̄) plane direction as the off-angle direction is used in the present embodiment, when the principal plane as a basis is the (1 0 0) plane, the similar effects, can be obtained by performing ion implantation from a (0 1̄ 1) plane direction or from a (0 1 1̄) plane direction even when a semiconductor substrate having a principal plane off-angled by 4° into the (0 0 1) plane direction is used. Moreover, the plane direction is not limited to such combinations, but the principal plane for forming an element may be the one meeting the following conditions: the principal plane forms an off-angle forming each angle θ with at least two planes perpendicular to a (1 0 0) plane as a reference within a range of $3.5° \leq \theta \leq 4.5°$, and an ion injecting direction for forming an semiconductor region constituting the photoelectric conversion element forms an angle φ to a direction perpendicular to the principal plane, in which the element is formed, within a range of $0° < \phi \leq 45°$, and further a direction of a projection of the ion injecting direction to the principal plane forms each angle α with the two plane directions within a range of $0° < \alpha < 90°$. Among them, it is especially preferable that the angle α is 45°.

Moreover, by substantially regulating the ion injecting direction as described above, the directions of a PD and a transfer gate, both constituting a photoelectric conversion element, and the off-angle form angles of 45°, and it becomes possible to suppress a channeling characteristic independent of an injecting angle of the N-type charge storage region.

Embodiment 2

Figure 4:
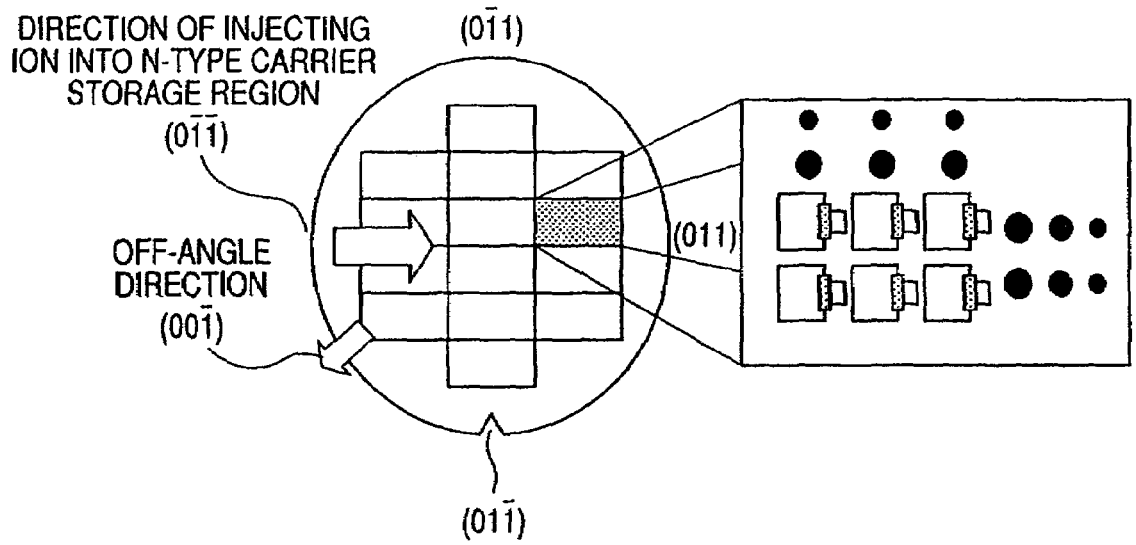
FIG. 4 is a figure showing a semiconductor substrate of a CMOS sensor and a PD forming method in Embodiment 2.

FIG. 4 is a figure showing a PD region forming method of a CMOS sensor in the present embodiment, and especially showing the principal plane direction of a semiconductor substrate, the PD, a transfer gate and an FD.

The formation conditions of each PD region are the same as those of Embodiment 1. In the present embodiment, a wafer notch position is (0 1 $\bar{1}$). To a substrate having the principal plane off-angled by 4° into a (0 0 $\bar{1}$) plane direction, an FD is arranged in a (0 1 1) plane direction to a photoelectric conversion element, and the N-type charge storage region 15 is injected so as to get into a part under the transfer gate (to be arranged under a part of the transfer gate) by a desired angle from a (0 $\bar{1}$ $\bar{1}$) plane direction, specifically an angle within a range of from 0° to 45° to the direction perpendicular to the principal plane having the off-angle.

Similarly to Embodiment 1, because the direction in which the ion injecting direction is projected onto the principal plane forms an angle of 45° with the off-angle direction, the lowering of the characteristics of the photoelectric conversion device owing to channeling can be suppressed. Moreover, by substantially regulating the ion injecting direction described above, the directions of the PD and the transfer gate for constituting the photoelectric conversion element and the off-angle direction form an angle of 45°. Consequently, the channeling characteristic can be suppressed independent of the injecting angle of the N-type charge storage region.

Embodiment 3

Figure 5:
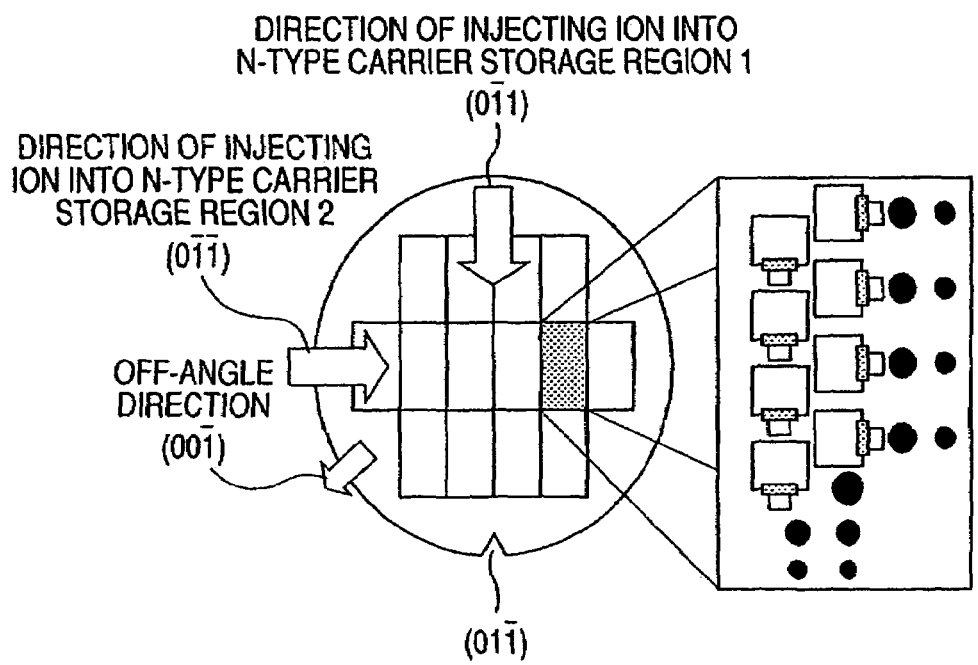
FIG. 5 is a figure showing a semiconductor substrate of a CMOS sensor and a PD forming method in Embodiment 3.
Figure 6:
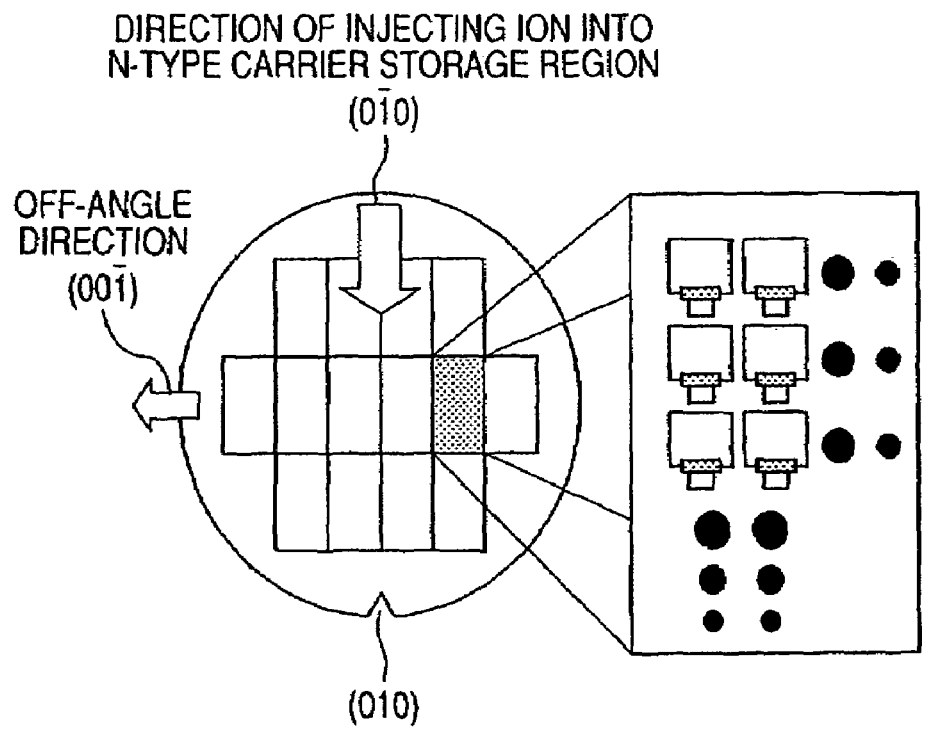
FIG. 6 is a figure for illustrating an example of a semiconductor substrate of a CMOS sensor and a PD forming method in a conventional technique.
Figure 7:
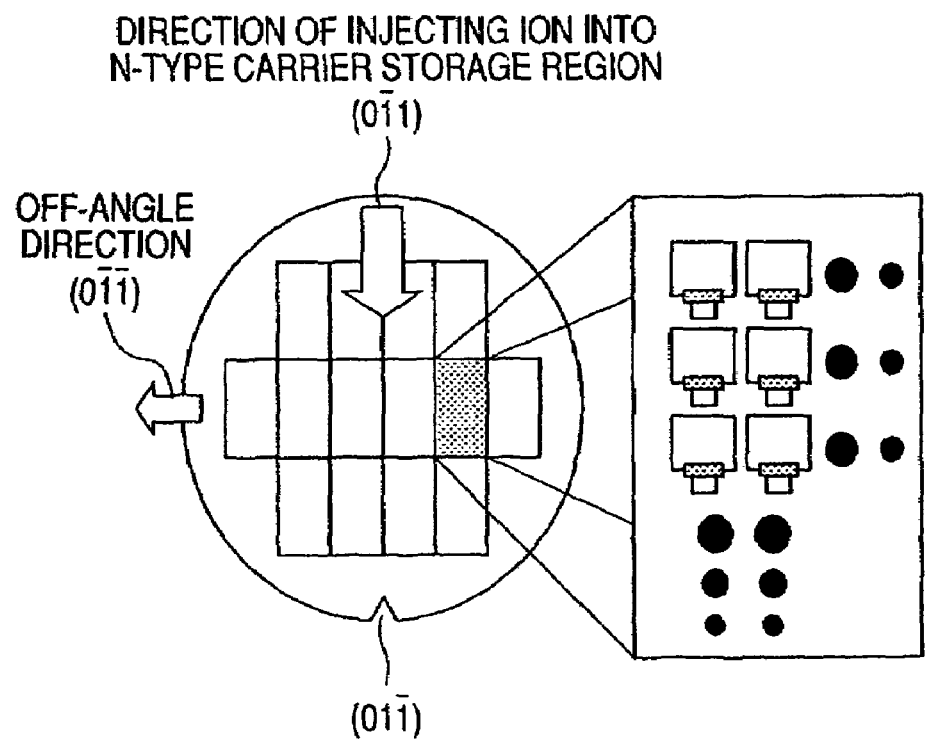
FIG. 7 is a figure for illustrating another example of a semiconductor substrate of a CMOS sensor and a PD forming method in a conventional technique.
Figure 8:
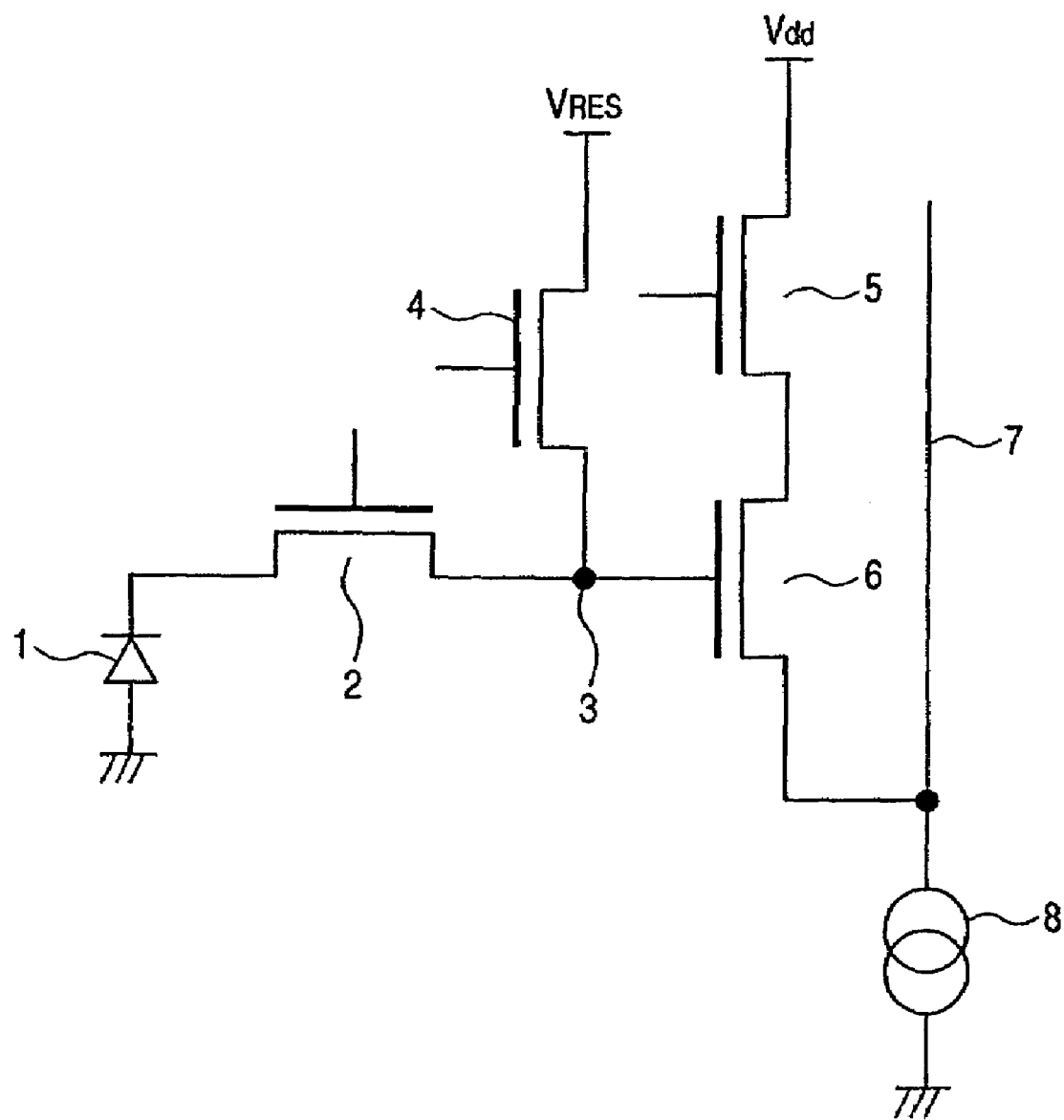
FIG. 8 is a diagram for illustrating the circuit configuration of a pixel in a CMOS sensor.
Figure 9:
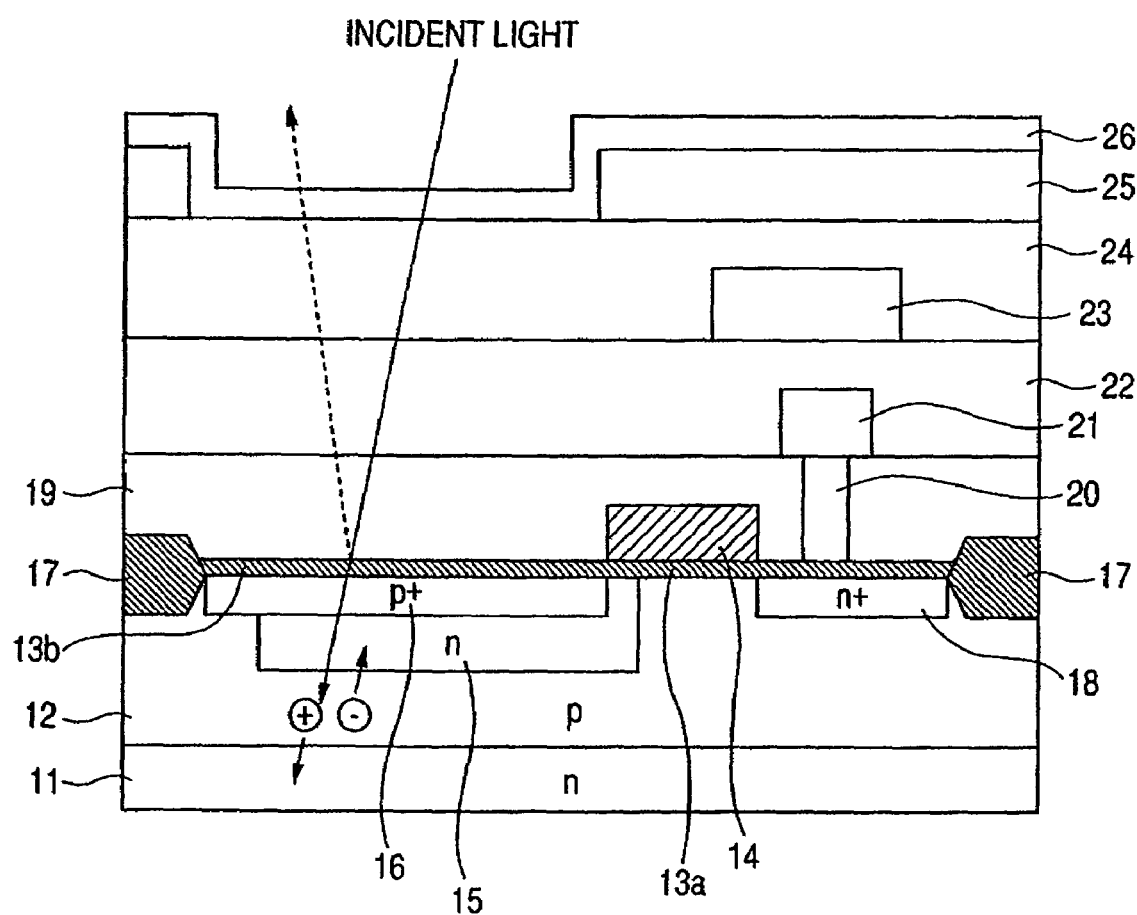
FIG. 9 is a schematic sectional view for illustrating the cross section of a pixel of a CMOS sensor.

In the present embodiment, a configuration including both the configurations described in Embodiments 1 and 2. FIG. 5 is a figure showing a PD region forming method of a CMOS sensor of the present embodiment, especially the principal plane of a semiconductor substrate, a PD, a transfer gate and a FD.

In the present embodiment, PD's are arranged to be divided into two groups, and the groups cross at a right angle with each other. The photolithography and ion implantation of the N-channel storage region are performed two times to each PD.

Because the wafer notch position and the off-angle direction are the same as those of the embodiment 1 and the angles formed between the off-angle direction are 45° at the injecting time of any of the N-type charge storage regions, the channeling characteristic becomes possible to be decreased to either of the PD's.

The following Table 1 is a table showing dispersion values measured from the output values of the area sensors equivalent to eight million pixels with regard to Embodiment 1-3. The measured values of the samples produced in Comparison Examples 1 (FIG. 4) and 2 (FIG. 5) are enumerated. In the configuration of FIG. 4, ion implantation is performed from a (0 $\bar{1}$ 0) plane direction, and the off-angle direction is the (0 0 $\bar{1}$) plane direction. Moreover, in the configuration of FIG. 5, ion implantation is performed from the (0 $\bar{1}$ 1) plane direction, and the off-angle direction is (0 $\bar{1}$ $\bar{1}$) plane direction. As shown in Table 1, it is known that the dispersion of about a half of that of Comparison Examples can be realized by using the present invention.

TABLE 1

Comparison of Each Characteristic of Each Embodiment with Each Comparison Example (%)

| | Comparison Example 1 | Comparison Example 2 | Embodiment 1 | Embodiment 2 | Embodiment 3 |
| --- | --- | --- | --- | --- | --- |
| Dispersion of Depleting Voltage | 15 | 16 | 8.2 | 8.1 | 8.3 |
| Dispersion of Transferable Voltage | 17 | 18 | 8.9 | 8.7 | 9 |
| Dispersion of Sensor Output | 15 | 16 | 7 | 7.2 | 7.8 |

Incidentally, with regard to Embodiments described above, it is needless to say that, if the inclination directions of the off-angles are in the same plane orientation directions, similar effects can be achieved also in the case where the off-angle is −4°, which is symmetrical to those of Embodiments against the principal plane orientation. Moreover, although an off-angle angle will include wafer manufacturing errors of about ±0.5°, the relations between the off-angle directions and injecting angles are always 45° according to the present invention, and consequently there are no problems about the manufacturing errors mentioned above. Furthermore, it has been also confirmed that the techniques of the present embodiment have similar effects also to the processes using an embedded type PD because the orientation of a plane grown by the epitaxial growth maintains the off-angle direction of the substrate.

Furthermore, although the embodiments shown above have been described using the CMOS type sensors as the photoelectric conversion devices, it is needless to say that similar advantages can be obtained when CCD type sensors are applied, because the difference is only that the FD is replaced by a VCCD.

Embodiment 4

Figure 10:
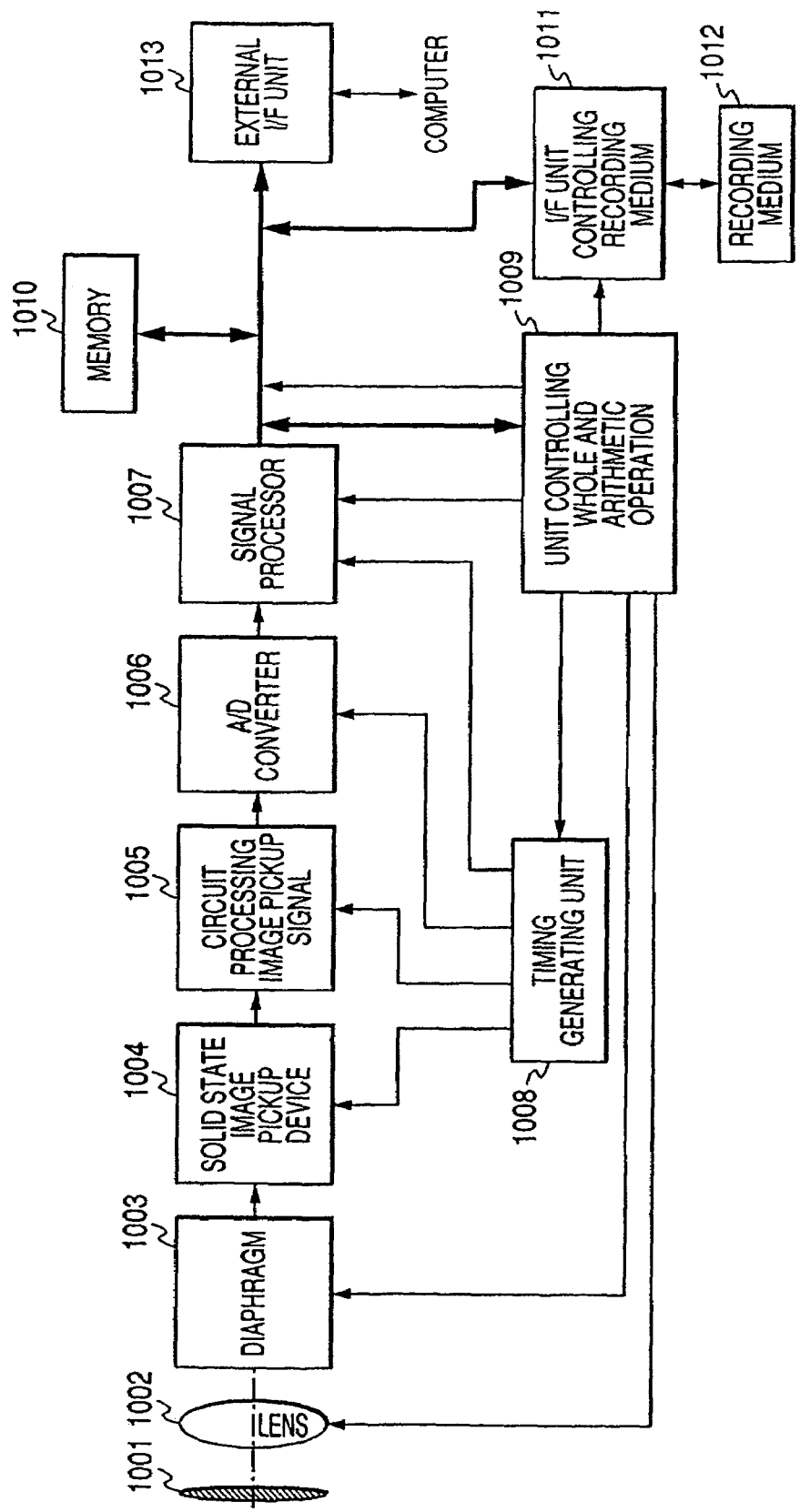
FIG. 10 is a diagram of a system in which a photoelectric conversion device according to the present invention is applied to an image pickup device.

FIG. 10 shows an example of the circuit block in the case where the photoelectric conversion device according to the present invention is applied to a camera. A shutter 1001 is located before a taking lens 1002, and controls exposure. A light quantity is controlled by the diaphragm 1003 as the need arises, and an image is formed on a photoelectric conversion device 1004. A signal output from the photoelectric conversion device 1004 is processed by a circuit 1005 processing a signal, and is converted from an analog signal to a digital signal by an A/D converter 1006. An output digital signal further receives the operation processing by a signal processor 1007. The processed digital signal is stored in a memory 1010, or is transmitted to external equipment through an external I/F 1013. The photoelectric conversion device 1004, the circuit 1005 processing an image pickup signal, the A/D converter 1006 and the signal processor 1007 are controlled by a timing generating unit 1008, and also the whole system is controlled by a unit 1009 controlling the whole and an arithmetic operation. In order to record an image on a recording medium 1012, an output digital signal is recorded through an I/F unit 1011 controlling a recording medium, which is controlled by the unit 1009 controlling the whole and an arithmetic operation.

This application claims priority from Japanese Patent Application No. 2004-379954 filed on Dec. 28, 2004, which is hereby incorporated by reference herein.

What is claimed is:

1. A manufacturing method of a photoelectric conversion device including a silicon substrate, a plurality of photoelectric conversion elements each including a charge storage region on a principal plane of the silicon substrate, and a plurality of transfer MOS transistors for transferring charge from the charge storage regions, wherein the principal plane has an off-angle orientation forming an angle $\theta$ with at least two planes arranged in opposition to each other and perpendicular to a reference (1 0 0) plane within a range of $3.5° \leq \theta \leq 4.5°$, and wherein the at least two planes form a two-plane direction, the method comprising:

forming the charge storage regions by injecting ions at an ion injecting direction into the plurality of photoelectric conversion elements, the ion injecting direction being a same direction for respective ones of the plurality of photoelectric conversion elements, such that the ion injecting direction forms an angle $\phi$ relative to a direction perpendicular to the principal plane within a range of $0° < \phi \leq 45°$, and such that a direction of a projection of the ion injecting direction to the principal plane forms an angle $\alpha$ with the two plane direction within a range of $0° < \alpha < 90°$, wherein for each charge storage region:
a part of the charge storage region is arranged under a part of a gate electrode of a corresponding transfer MOS transistor, and
a direction of the part of the charge storage region arranged under the gate electrode as seen from a corresponding photoelectric conversion element forms the angle $\alpha$ with the two plane direction within a range of $40° \leq \alpha \leq 50°$.

2. A manufacturing method of a photoelectric conversion device according to claim 1, wherein an off-angle direction of the principal plane is in a (0 0 1) or a (0 0 $\bar{1}$) plane direction from a [1 0 1] axis perpendicular to the reference (1 0 0)plane.

3. A manufacturing method of a photoelectric conversion device according to claim 1, wherein the method further comprising forming an epitaxial layer on the silicon substrate.

4. A manufacturing method of a photoelectric conversion device according to claim 1, wherein the method further comprises:
forming a plurality of floating diffusion regions respectively corresponding to the plurality of photoelectric conversion elements,
wherein each floating diffusion region is for converting charges from a corresponding photoelectric conversion element into a voltage, and
wherein each floating diffusion region is arranged at a position opposed to a corresponding photoelectric conversion element and opposed to a gate electrode of a corresponding transfer MOS transistor.

5. A manufacturing method of a photoelectric conversion device according to claim 1, wherein for each charge storage region:
a part of the charge storage region is arranged under a part of a gate electrode of a corresponding transfer MOS transistor, and
a longitudinal direction of the gate electrode of the transfer MOS transistor is perpendicular to the ion injection direction.

* * * * *